US012578395B2

(12) United States Patent
Woo et al.

(10) Patent No.: US 12,578,395 B2
(45) Date of Patent: Mar. 17, 2026

(54) APPARATUS AND METHOD FOR DIAGNOSING STATE OF BATTERY

(71) Applicant: LG Energy Solution, Ltd., Seoul (KR)

(72) Inventors: Kyung-Hwa Woo, Daejeon (KR); Yoon-Jung Bae, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/836,803

(22) PCT Filed: Sep. 21, 2023

(86) PCT No.: PCT/KR2023/014436
§ 371 (c)(1),
(2) Date: Aug. 8, 2024

(87) PCT Pub. No.: WO2024/063575
PCT Pub. Date: Mar. 28, 2024

(65) Prior Publication Data
US 2025/0138102 A1     May 1, 2025

(30) Foreign Application Priority Data

Sep. 21, 2022   (KR) ........................ 10-2022-0119253
Sep. 21, 2023   (KR) ........................ 10-2023-0126116

(51) Int. Cl.
*G01R 31/392*   (2019.01)
*G01R 31/385*   (2019.01)
*G01R 31/389*   (2019.01)
*H01M 10/42*   (2006.01)

(52) U.S. Cl.
CPC ......... *G01R 31/392* (2019.01); *G01R 31/385* (2019.01); *G01R 31/389* (2019.01); *H01M 10/425* (2013.01); *H01M 2010/4271* (2013.01); *H01M 2010/4278* (2013.01)

(58) Field of Classification Search
CPC .................................................. H01M 10/425
See application file for complete search history.

(56) References Cited

U.S. PATENT DOCUMENTS

| | | |
|---|---|---|
| 2001/0028238 A1 | 10/2001 | Nakamura et al. |
| 2010/0042345 A1 | 2/2010 | Kang et al. |
| 2010/0072951 A1 | 3/2010 | Nakashima |
| 2011/0256434 A1 | 10/2011 | Kang et al. |
| 2014/0009123 A1* | 1/2014 | Park ..................... G01R 31/392 320/152 |
| 2014/0312910 A1 | 10/2014 | Cho et al. |
| 2015/0137822 A1 | 5/2015 | Joe et al. |
| 2021/0218262 A1* | 7/2021 | Bae ..................... H02J 7/0013 |
| 2021/0318388 A1 | 10/2021 | Bae et al. |
| 2021/0325475 A1 | 10/2021 | Bae et al. |
| 2021/0325476 A1 | 10/2021 | Bae et al. |
| 2021/0344212 A1 | 11/2021 | Jee et al. |
| 2023/0140094 A1 | 5/2023 | Cha et al. |
| 2023/0168292 A1 | 6/2023 | Bae et al. |
| 2023/0176128 A1 | 6/2023 | Bae et al. |
| 2023/0314515 A1 | 10/2023 | Bae et al. |

FOREIGN PATENT DOCUMENTS

| | | |
|---|---|---|
| CN | 107861070 A | 3/2018 |
| CN | 113721156 A | 11/2021 |
| CN | 112710957 B | 9/2022 |
| EP | 3916884 A1 | 12/2021 |
| JP | 2002042895 A | 2/2002 |
| JP | 2007028844 A | 2/2007 |
| JP | 2007113953 A | 5/2007 |
| JP | 2008181866 A | 8/2008 |
| JP | 2015529792 A | 10/2015 |
| JP | 2022503510 A | 1/2022 |
| KR | 100927541 B1 | 11/2009 |
| KR | 20140125473 A | 10/2014 |
| KR | 20200111014 A | 9/2020 |
| KR | 20200111017 A | 9/2020 |
| KR | 20220056150 A | 5/2022 |
| KR | 20220067328 A | 5/2022 |
| KR | 20220080620 A | 6/2022 |
| KR | 20220093842 A | 7/2022 |

OTHER PUBLICATIONS

International Search Report for Application No. PCT/KR2023/014436 mailed Jan. 18, 2024, pp. 1-3.
Extended European Search Report including Written Opinion for Application No. 23868627.3 dated Jun. 24, 2025, pp. 1-8.

* cited by examiner

*Primary Examiner* — Olatunji A Godo

(74) *Attorney, Agent, or Firm* — Lerner David LLP

(57)   ABSTRACT

An apparatus for diagnosing a state of a battery includes a voltage measuring unit configured to measure a voltage of a battery and measure a target voltage for the battery when the measured voltage reaches a preset first reference voltage, a resistance measuring unit configured to measure a target resistance of the battery when the measured voltage reaches a preset second reference voltage, and a control unit configured to determine a voltage increase/decrease pattern for the target voltage based on a voltage profile in which the target voltage is stored, determine a resistance increase/decrease pattern for the target resistance based on a resistance profile in which the target resistance is stored, and diagnose a state of the battery from the voltage increase/decrease pattern and the resistance increase/decrease pattern according to a preset diagnostic rule.

16 Claims, 11 Drawing Sheets

| RESISTANCE INCREASE/DECREASE PATTERN VOLTAGE INCREASE/DECREASE PATTERN | FIRST RESISTANCE PATTERN | SECOND RESISTANCE PATTERN |
|---|---|---|
| FIRST VOLTAGE PATTERN | ELECTROLYTE SIDE REACTION STATE | LITHIUM PRECIPITATION STATE |
| SECOND VOLTAGE PATTERN | POSITIVE ELECTRODE DETERIORATION STATE | NEGATIVE ELECTRODE STABILIZATION STATE |

FIG. 6

FIRST VOLTAGE PROFILE(VP1)

FIRST RESISTANCE PROFILE(RP1)

FIG. 8

SECOND VOLTAGE PROFILE(VP2)

SECOND RESISTANCE PROFILE(RP2)

APPARATUS AND METHOD FOR DIAGNOSING STATE OF BATTERY

CROSS-REFERENCE TO RELATED APPLICATIONS

The present application is a national phase entry under 35 U.S.C. § 371 of International Application No. PCT/KR2023/014436, filed Sep. 21, 2023, now published as International Publication No. WO 2024/063575 A1, which claims priority from Korean Patent Application Nos. 10-2022-0119253, filed on Sep. 21, 2022, and 10-2023-0126116, filed on Sep. 21, 2023, all of which are hereby incorporated herein by reference in their entireties.

TECHNICAL FIELD

The present disclosure relates to an apparatus and method for diagnosing a state of a battery, and more particularly, to an apparatus and method for diagnosing a state of a battery, which is capable of diagnosing a state of a battery.

BACKGROUND

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Although much research is being done on the batteries in terms of increasing capacity and density, improvements in lifespan and safety are also important.

For example, it is necessary to prevent lithium precipitation on the surface of the negative electrode (lithium plating, Li-plating). When lithium is precipitated on the surface of the negative electrode, it causes side reactions with the electrolyte and changes in the kinetic balance or the like of the battery, causing battery deterioration. In addition, as lithium metal is precipitated on the surface of the negative electrode, an internal short circuit of the battery may occur, and thus there is a risk of ignition or explosion due to an internal short circuit.

As another example, in addition to lithium precipitation, electrolyte side reaction and positive electrode deterioration may also affect the lifespan and stability of the battery.

Therefore, there is a need for technology that can improve the lifespan and stability of the battery by accurately and quickly diagnosing the current state of the battery.

SUMMARY

Technical Problem

The present disclosure is designed to solve the problems of the related art, and therefore the present disclosure is directed to providing an apparatus and method for diagnosing a state of a battery, which is capable of quickly and accurately diagnosing a current state of a battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

An apparatus for diagnosing a state of a battery according to one aspect of the present disclosure may comprise a control unit configured to receive a measured target voltage of the battery, wherein the target voltage of the battery is measured when a measured voltage of the battery reaches a preset first reference voltage, receive a target resistance of the battery, wherein the target resistance of the battery is measured when the measured voltage of the battery reaches a preset second reference voltage, determine a voltage increase/decrease pattern for the target voltage based on a voltage profile in which the target voltage is stored, determine a resistance increase/decrease pattern for the target resistance based on a resistance profile in which the target resistance is stored, and diagnose a state of the battery from the voltage increase/decrease pattern and the resistance increase/decrease pattern according to a preset diagnostic rule.

The control unit may be configured to determine whether the voltage increase/decrease pattern belongs to a first voltage pattern or to a second voltage pattern, determine whether the resistance increase/decrease pattern belongs to a first resistance pattern or to a second resistance pattern, and diagnose the state of the battery based on a combination of whether the voltage increase/decrease pattern belongs to the first voltage pattern or to the second voltage pattern and whether the resistance increase/decrease pattern belongs to the first resistance pattern or to the second resistance pattern.

The control unit may be configured to diagnose the state of the battery as one of an electrolyte side reaction state, a lithium precipitation state, a positive electrode deterioration state, or a negative electrode stabilization state.

The control unit may be configured to diagnose the state of the battery as the electrolyte side reaction state in response to the voltage increase/decrease pattern belonging to the first voltage pattern and the resistance increase/decrease pattern belonging to the first resistance pattern.

The control unit may be configured to diagnose the state of the battery as the lithium precipitation state in response to the voltage increase/decrease pattern belonging to the first voltage pattern and the resistance increase/decrease pattern belonging to the second resistance pattern.

The control unit may be configured to diagnose the state of the battery as the positive electrode deterioration state in response to the voltage increase/decrease pattern belonging to the second voltage pattern and the resistance increase/decrease pattern belonging to the first resistance pattern.

The control unit may be configured to diagnose the state of the battery as the negative electrode stabilization state in response to the voltage increase/decrease pattern belonging to be the second voltage pattern and the resistance increase/decrease pattern belonging to the second resistance pattern.

The control unit may be configured to control an operation condition of the battery based on the diagnosed state of the battery.

The control unit may be configured to reduce at least one of a temperature and an upper limit SOC of the battery in response to the state of the battery being diagnosed as the electrolyte side reaction state or the positive electrode deterioration state.

The control unit may be configured to reduce an upper limit of a charge/discharge C-rate of the battery in response to the state of the battery being diagnosed as the lithium precipitation state.

The control unit may be configured to diagnose the state of the battery in response to an update to the voltage profile and the resistance profile of the battery.

The target resistance may be based on a voltage change amount of the battery during a predetermined period of time beginning when the measured voltage reaches the second reference voltage.

The first reference voltage may be a discharge end voltage set for the battery.

The second reference voltage may correspond to a voltage value in a flat section of the resistance profile. The resistance profile may be a negative electrode resistance profile A battery pack according to another aspect of the present disclosure may comprise the apparatus for diagnosing a state of a battery according to any of the embodiments of the present disclosure.

A method for diagnosing a state of a battery according to still another aspect of the present disclosure may comprise measuring a voltage of a battery; measuring a target voltage for the battery when the measured voltage reaches a preset first reference voltage and measuring a target resistance of the battery when the measured voltage reaches a preset second reference voltage; determining a voltage increase/decrease pattern for the target voltage based on a voltage profile in which the target voltage is stored and determining a resistance increase/decrease pattern for the target resistance based on a resistance profile in which the target resistance is stored; and diagnosing a state of the battery from the voltage increase/decrease pattern and the resistance increase/decrease pattern according to a preset diagnostic rule.

Advantageous Effects

According to one aspect of the present disclosure, the state of the battery may be classified and diagnosed in detail according to the combination of the voltage increase/decrease pattern and the resistance increase/decrease pattern of the battery.

Also, according to one aspect of the present disclosure, since the state of the battery may be diagnosed based on voltage and resistance, the current state of the battery may be diagnosed quickly.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 6 is a diagram schematically showing a first voltage profile for a first battery according to an embodiment of the present disclosure.

FIG. 8 is a diagram schematically showing a second voltage profile for a second battery according to an embodiment of the present disclosure.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
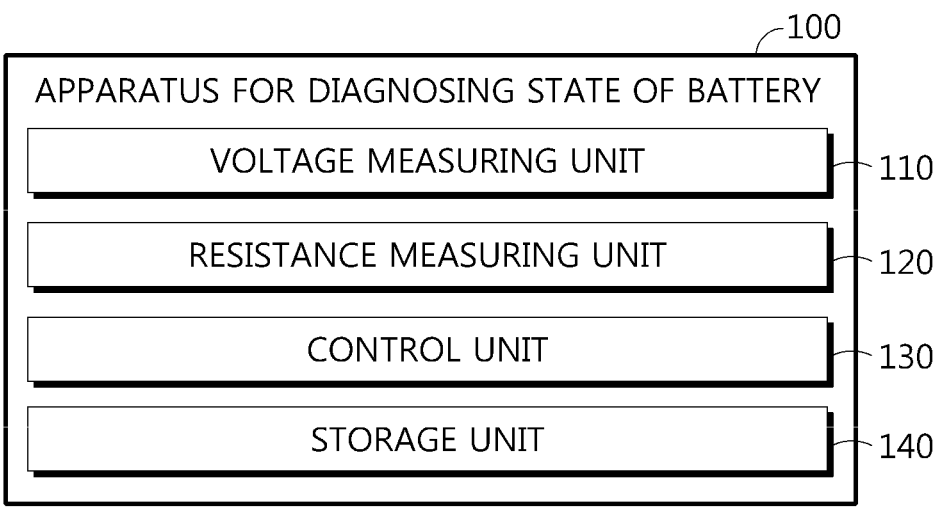
FIG. 1 is a diagram schematically showing an apparatus for diagnosing a state of a battery according to an embodiment of the present disclosure.

FIG. 1 is a diagram schematically illustrating an apparatus 100 for diagnosing a state of a battery according to an embodiment of the present disclosure.

Referring to FIG. 1, the apparatus 100 for diagnosing a state of a battery may include a voltage measuring unit 110, a resistance measuring unit 120 and a control unit 130.

Here, the battery refers to an independent cell that has a negative electrode terminal and a positive electrode terminal and is physically separable. As an example, a lithium-ion battery or a lithium polymer battery may be considered a battery. Additionally, the battery may mean a battery module in which a plurality of cells are connected in series and/or parallel. Below, for convenience of explanation, the battery is explained as meaning one independent cell.

The voltage measuring unit 110 may be configured to measure the voltage of the battery.

Specifically, the voltage measuring unit 110 may be electrically connected to the positive electrode terminal and the negative electrode terminal of the battery. Additionally, the voltage measuring unit 110 may measure the terminal voltage of the battery by measuring the positive electrode potential and the negative electrode potential of the battery and calculating the difference between the positive electrode potential and the negative electrode potential.

The voltage measuring unit 110 may be configured to measure the target voltage for the battery when the measured voltage reaches a preset first reference voltage.

Here, the first reference voltage may be a discharge end voltage set for the battery. For example, the first reference voltage is a discharge end voltage that may be set to reflect the current state of the battery and may be a lower limit voltage for the battery. That is, the first reference voltage for one battery may be set to 2.8 [V], and the first reference voltage for another battery may be set to 3.2 [V].

Specifically, the voltage measuring unit 110 may measure the target voltage of the battery whenever the voltage of the battery reaches the first reference voltage set for the battery. Preferably, the target voltage may be an open circuit voltage (OCV).

For example, from the time the battery voltage reaches the first reference voltage, the battery may be in an idle state for about 10 minutes. That is, when the battery is discharged to the first reference voltage, the battery may be in an unloaded state for a certain period of time. The voltage measuring unit 110 may measure the target voltage of the battery after the state of the battery is stabilized (that is, after the unloaded state is maintained for a certain period of time).

The resistance measuring unit 120 may be configured to measure the target resistance of the battery when the measured voltage reaches a preset second reference voltage.

Here, the second reference voltage may be a voltage belonging to a preset negative electrode flat section among the available voltage section of the battery. Specifically, the second reference voltage may be any one voltage belonging to the negative electrode flat section among the available voltage section of the battery. For example, the second reference voltage may mean a voltage value with the lowest corresponding resistance value in the negative electrode flat section. As another example, the second reference voltage may mean the smallest voltage value in the negative electrode flat section. In other words, the second reference voltage may be applied without limitation as long as it is a voltage value belonging to the negative electrode flat section.

Specifically, the negative electrode flat section refers to a voltage section in which the negative electrode resistance does not change significantly even if the negative electrode voltage increases. Below, the negative electrode flat section is specifically defined through the first to third embodiments.

Figure 2:
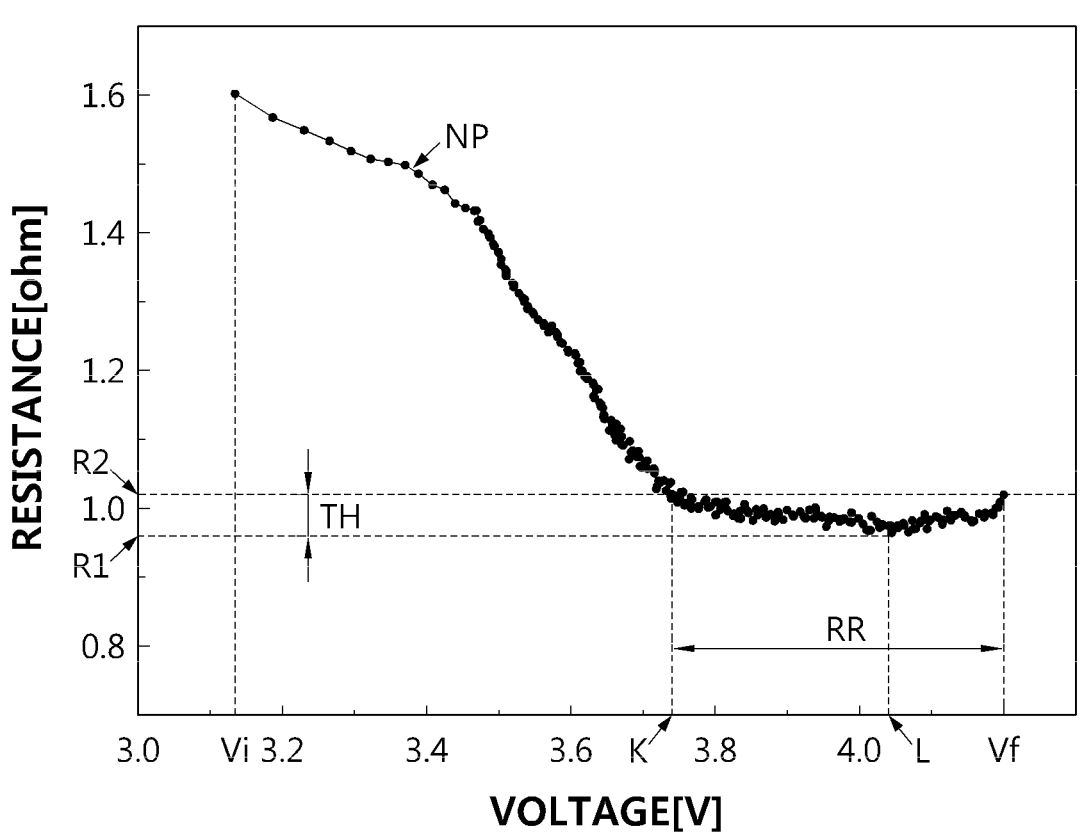
FIG. 2 is a diagram schematically showing an embodiment of a negative electrode resistance profile.

FIG. 2 is a diagram schematically showing an embodiment of a negative electrode resistance profile NP. Specifically, the negative electrode resistance profile NP in FIG. 2 is a profile showing the corresponding relationship between voltage and resistance for the negative electrode of the battery. Preferably, the negative electrode resistance profile NP may be a profile obtained for a reference battery corresponding to the battery. Here, the reference battery refers to a battery in the BOL (Beginning of Life) state, or may be a reference battery manufactured to correspond to a battery in the BOL state. For example, in the embodiment of FIG. 2, the available voltage section of the battery may be Vi [V] to Vf [V]. Among the voltages belonging to the available voltage section Vi to Vf, the first resistance value R1 corresponding to L [V] may be the minimum resistance.

In the first embodiment, the negative electrode flat section RR may be defined as a voltage section in which the change rate of the negative electrode resistance to the negative electrode voltage is greater than or equal to a reference value. In the embodiment of FIG. 2, since the resistance decreases as the voltage of the negative electrode increases, the change rate of resistance to voltage in the voltage section of Vi [V] to L [V] may be calculated as a negative number. Also, in the voltage section of L [V] to Vf [V], the change rate of resistance to voltage may be calculated as a positive number. Specifically, the slope (instantaneous change rate of resistance to voltage) at the point corresponding to K [V] may be greater than or equal to the preset reference value. Also, even in a high voltage section above K [V], the slope may be maintained to be greater than or equal to the reference value. That is, in the voltage section of K [V] to Vf [V], the slope may be maintained to be greater than or equal to the reference value. Therefore, the voltage section of K [V] to Vf [V], where the change rate of resistance to voltage is greater than or equal to the reference value, may correspond to the negative electrode flat section RR.

In the second embodiment, the negative electrode flat section RR may be defined as a voltage section corresponding to the resistance section belonging to a threshold resistance from the minimum resistance of the negative electrode resistance profile NP. In the embodiment of FIG. 2, the minimum resistance of the negative electrode resistance profile NP is a first resistance value R1. Accordingly, the voltage section K to Vf corresponding to the resistance section R1 to R2 belonging to the threshold resistance TH from the first resistance value R1 may correspond to the negative electrode flat section RR.

For example, the threshold resistance TH may be set as a resistance difference between the minimum resistance (first resistance value R1) of the negative electrode resistance profile NP and the resistance corresponding to the maximum voltage Vf. In the embodiment of FIG. 2, the resistance value corresponding to the voltage Vf [V] is the second resistance value R2, so the threshold voltage TH may be set as the resistance difference between the first resistance value R1 and the second resistance value R2. In addition, the voltage section K to Vf corresponding to the resistance section R1 to R2 belonging to the threshold voltage TH from the first resistance value R1 may correspond to the negative electrode flat section RR.

In the third embodiment, the negative electrode flat section RR may be defined based on the battery profile and the differential profile for the battery.

Figure 3:
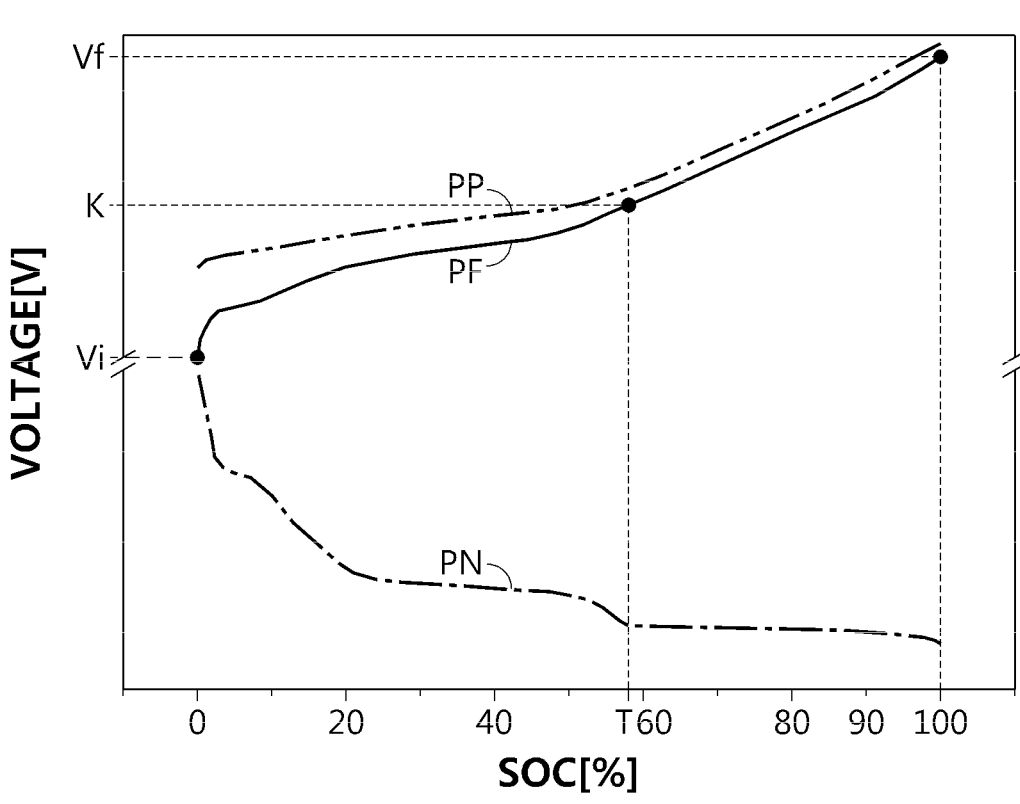
FIG. 3 is a diagram schematically showing an embodiment of a battery profile.

FIG. 3 is a diagram schematically showing an embodiment of a battery profile PF. Specifically, in the embodiment of FIG. 3, the battery profile PF is a profile indicating the corresponding relationship between SOC (State of Charge) and voltage for the reference battery. The positive electrode profile PP is a profile indicating the corresponding relationship between SOC and voltage for the positive electrode of the reference battery, and the negative electrode profile PN is a profile indicating the corresponding relationship between SOC and voltage for the negative electrode of the reference battery.

Figures 4, 5:
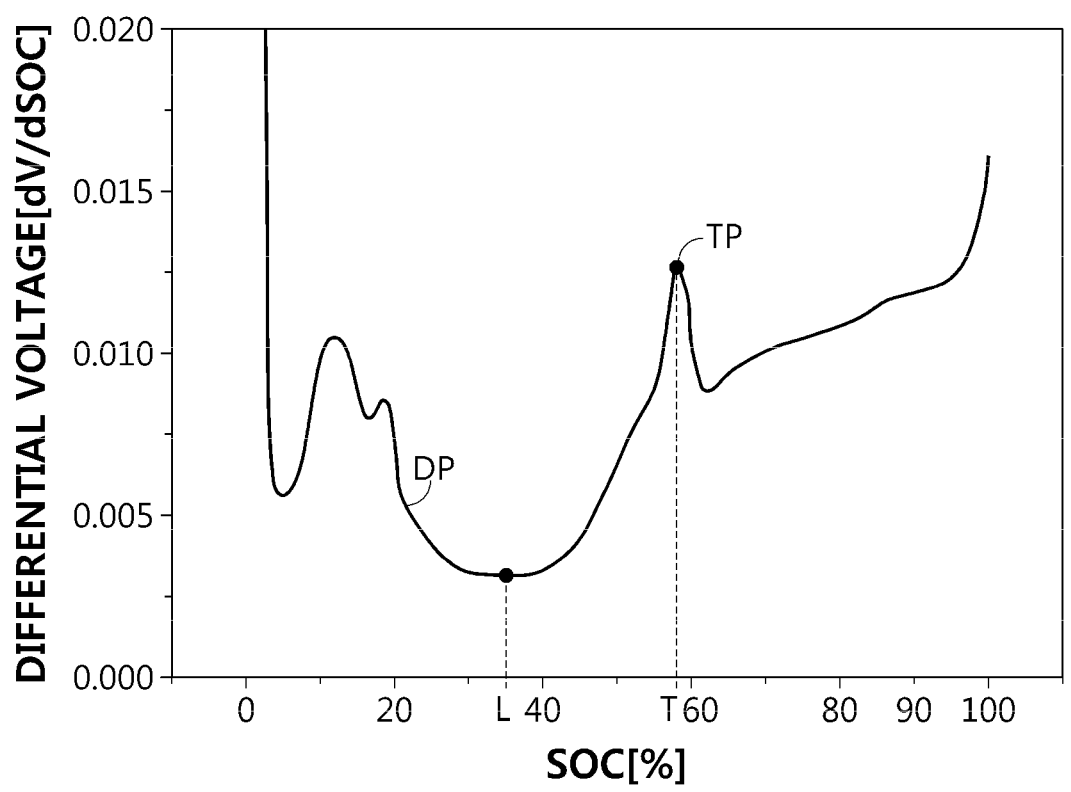
FIG. 4 is a diagram schematically showing an embodiment of a differential profile.
FIG. 5 is a diagram schematically showing a preset diagnostic rule used by the apparatus for diagnosing a state of a battery according to an embodiment of the present disclosure.

FIG. 4 is a diagram schematically showing an embodiment of a differential profile DP. Specifically, in the embodiment of FIG. 4, the differential profile is a profile indicating the corresponding relationship between the SOC of the reference battery and the differential voltage. Here, the differential voltage is a value obtained by differentiating voltage by SOC and may be expressed as 'dV/dSOC'.

In the embodiment of FIG. 4, the SOC corresponding to the lowest differential voltage in the differential profile is L [%]. The target peak TP is included in the SOC section greater than or equal to L [%], and the SOC corresponding to the target peak TP is T [%]. For example, the peak with the lowest corresponding SOC in the SOC section greater than or equal to L [%] may be determined as the target peak TP. In other words, the maximum point (SOC T [%] point) that appears first after the minimum point (SOC L [%] point) corresponding to the lowest differential voltage in the differential profile may be determined as the target peak TP.

Generally, it is known that in the voltage section after the target peak TP, the positive electrode reacts dominantly, and the negative electrode participates less in the reaction. Therefore, the SOC corresponding to the target peak TP in the differential profile may be specified as T [%]. In the embodiment of FIG. 3, the voltage corresponding to SOC T [%] in the battery profile PF is K [V]. In other words, the voltage section of K [V] to Vf [V] is a voltage section in which the positive electrode reacts predominantly. Therefore, the voltage section of K [V] to Vf [V] may correspond to the negative electrode flat section RR.

Specifically, when the measured voltage reaches the second reference voltage, the resistance measuring unit 120 may measure the target resistance of the battery based on the voltage change amount of the battery during a predetermined time.

In one embodiment, the resistance measuring unit 120 may measure the discharging current amount for a predetermined period of time from the time that the measured voltage reaches the second reference voltage. Additionally, the resistance measuring unit 120 may calculate the voltage change amount based on the battery voltage measured by the voltage measuring unit 110 for a predetermined period of time.

For example, assume that the time when the measured voltage reaches the second reference voltage is t1, and the predetermined time is $\Delta t$. From time t1 to time $\Delta t$, the voltage measuring unit 110 may measure the voltage of the battery, and the resistance measuring unit 120 may measure the discharging current amount. Additionally, the resistance measuring unit 120 may calculate the target resistance of the battery using the voltage change amount ($\Delta V$) and the discharging current amount ($\Delta I$) during $\Delta t$ time. In other words, the resistance measuring unit 120 may calculate the target resistance using Ohm's law.

In another embodiment, the resistance measuring unit 120 may be configured to output a pulse signal to the battery for a predetermined period of time when the measured voltage reaches the second reference voltage.

Specifically, the resistance measuring unit 120 may be electrically connected to the positive electrode terminal and the negative electrode terminal of the battery. Also, the resistance measuring unit 120 may output a pulse signal with a predetermined size to the battery. For example, the resistance measuring unit 120 may output a pulse signal with a magnitude of T [mA] for 0.1 seconds in the discharge direction of the battery. In other words, the resistance measuring unit 120 may output a pulse signal to the negative electrode terminal of the battery.

Additionally, the resistance measuring unit 120 may be configured to measure the target resistance based on the voltage change amount of the battery while a pulse signal is applied.

When a pulse signal is applied in the discharge direction of the battery, the voltage of the battery may drop. That is, the voltage measuring unit 110 may measure the voltage of the battery for a predetermined period of time when a pulse signal is applied. Additionally, the resistance measuring unit 120 may calculate the voltage difference ($\Delta V$) between the voltage of the battery and the second reference voltage at the point when output of the pulse signal ends. Here, the voltage difference ($\Delta V$) may be calculated according to the formula "second reference voltage–battery voltage".

Additionally, the resistance measuring unit 120 may calculate the current amount ($\Delta I$) applied to the battery for a predetermined period of time. Here, the current amount may be calculated according to the formula "predetermined time×current amount".

Also, the resistance measuring unit 120 may measure the target resistance from voltage difference ($\Delta V$) and the current amount ($\Delta I$). Here, the target resistance may be calculated according to the formula "voltage difference÷current amount".

The control unit 130 may be configured to determine a voltage increase/decrease pattern for the target voltage based on the voltage profile in which the target voltage is stored.

Specifically, the control unit 130 may be configured to determine the voltage increase/decrease pattern as the first voltage pattern or the second voltage pattern.

For example, the control unit 130 may select a plurality of target voltages from the voltage profile. Preferably, the control unit 130 may select a plurality of recently stored target voltages among the plurality of target voltages included in the voltage profile. Also, the control unit 130 may determine the voltage increase/decrease pattern for the battery by comparing the sizes of the selected plurality of target voltages.

If the size of the target voltage increases as time passes, the voltage increase/decrease pattern for the battery may be determined as the first voltage pattern.

Conversely, if the size of the target voltage decreases as time passes, the voltage increase/decrease pattern for the battery may be determined as the second voltage pattern. In addition, even if the size of the target voltage remains constant even as time passes, that is, even if the difference in the size of the plurality of target voltages is smaller than a predetermined threshold, the voltage increase/decrease pattern for the battery may be determined as the second voltage pattern.

The control unit 130 may be configured to determine a resistance increase/decrease pattern for the target resistance based on a resistance profile in which the target resistance is stored.

The control unit 130 may be configured to determine the resistance increase/decrease pattern as the first resistance pattern or the second resistance pattern.

For example, the control unit 130 may select a plurality of target resistances from the resistance profile. Preferably, the control unit 130 may select a plurality of recently stored target resistances among the plurality of target resistances included in the resistance profile. Also, the control unit 130 may determine the resistance increase/decrease pattern for the battery by comparing the sizes of the selected plurality of target resistances.

If the size of the target resistance increases as time passes, the resistance increase/decrease pattern for the battery may be determined as the first resistance pattern.

Conversely, if the size of the target resistance decreases over time, the resistance increase/decrease pattern for the battery may be determined as the second resistance pattern. In addition, even if the size of the target resistance remains constant even as time passes, that is, even if the difference in the size of the plurality of target resistances is smaller than a predetermined threshold, the resistance increase/decrease pattern for the battery may be determined as the second resistance pattern.

Preferably, both of the corresponding target voltage and target resistance may be measured in one discharge cycle for the battery. That is, in any one discharge cycle, the target resistance may be measured when the voltage of the battery reaches the second reference voltage, and the target voltage may be measured when the voltage of the battery reaches the first reference voltage. In other words, the plurality of target voltages and the plurality of target resistances selected by the control unit 130 may be said to be a plurality of target voltage and target resistance pairs selected to correspond to each other.

The control unit 130 may be configured to diagnose the state of the battery from voltage increase/decrease pattern and the resistance increase/decrease pattern according to a preset diagnostic rule.

Specifically, the control unit 130 may be configured to diagnose the state of the battery differently depending on the combination of the voltage increase/decrease pattern and the resistance increase/decrease pattern. Preferably, the control unit 130 may be configured to diagnose the state of the battery as an electrolyte side reaction state, a lithium precipitation state, a positive electrode deterioration state, or a negative electrode stabilization state. That is, the control unit 130 may diagnose the state of the battery as an electrolyte side reaction state, a lithium precipitation state, a positive electrode deterioration state, or a negative electrode stabilization state according to the combination of the voltage increase/decrease pattern and the resistance increase/decrease pattern.

Here, the electrolyte side reaction state refers to a state in which the performance of the battery is reduced due to a side reaction occurring in the electrolyte. For example, the electrolyte side reaction refers to the reduction and decomposition reaction of electrolyte on the surface of the negative electrode. Also, the lithium precipitation state refers to a state in which lithium metal is precipitated on the surface of the negative electrode of the battery. Also, the positive electrode deterioration state refers to a state in which the positive electrode is deteriorated due to loss of capacity of the positive electrode. In other words, the electrolyte side reaction state, the lithium precipitation state, and the positive electrode deterioration state may be abnormal states that may appear in a defective battery.

The negative electrode stabilization state refers to a state in which the negative electrode of the battery is stabilized. For example, the negative electrode stabilization state mainly appears in the initial cycle when the battery begins to be used, and refers to a state in which the reaction area of the negative electrode increases during the expansion and contraction of the active material during initial charge/discharge. The negative electrode stabilization state may be a normal state that may occur in a normal battery.

FIG. 5 is a diagram schematically showing a preset diagnostic rule used by the apparatus 100 for diagnosing a state of a battery according to an embodiment of the present disclosure.

The control unit 130 may be configured to diagnose the state of the battery as an electrolyte side reaction state when the voltage increase/decrease pattern is determined to be the first voltage pattern and the resistance increase/decrease pattern is determined to be the first resistance pattern.

The control unit 130 may be configured to diagnose the state of the battery as a lithium precipitation state when the voltage increase/decrease pattern is determined to be the first voltage pattern and the resistance increase/decrease pattern is determined to be the second resistance pattern.

The control unit 130 may be configured to diagnose the state of the battery as a positive electrode deterioration state when the voltage increase/decrease pattern is determined to be the second voltage pattern and the resistance increase/decrease pattern is determined to be the first resistance pattern.

The control unit 130 may be configured to diagnose the state of the battery as a negative electrode stabilization state when the voltage increase/decrease pattern is determined to be the second voltage pattern and the resistance increase/decrease pattern is determined to be the second resistance pattern.

The apparatus 100 for diagnosing a state of a battery according to an embodiment of the present disclosure may has the advantage of diagnosing the state of the battery by classifying it in detail into four types according to the combination of the voltage increase/decrease pattern and the resistance increase/decrease pattern of the battery. Since state of the battery may be diagnosed based on voltage and resistance, the current state of the battery may be diagnosed quickly. Therefore, according to the present disclosure, there is an advantage that the current state of the battery may be diagnosed quickly and accurately.

Meanwhile, the control unit 130 included in the apparatus 100 for diagnosing a state of a battery may optionally include processors, application-specific integrated circuits (ASICs), other chipsets, logic circuits, registers, communication modems, data processing devices, etc. known in the art to execute various control logics performed in the present disclosure. Also, when the control logic is implemented as software, the control unit 130 may be implemented as a set of program modules. At this time, the program module may be stored in the memory and executed by the control unit 130. The memory may be inside or outside the control unit 130 and may be connected to the control unit 130 by various well-known means.

In addition, the apparatus 100 for diagnosing a state of a battery may further include a storage unit 140. The storage unit 140 may store data necessary for operation and function of each component of the apparatus 100 for diagnosing a state of a battery, data generated in the process of performing the operation or function, or the like. The storage unit 140 is not particularly limited in its kind as long as it is a known information storage means that can record, erase, update and read data. As an example, the information storage means may include random access memory (RAM), flash memory, read-only memory (ROM), electrically erasable program-mable read-only memory (EEPROM), registers, and the like. In addition, the storage unit 140 may store program codes in which processes executable by the control unit 130 are defined.

For example, the voltage profile, the resistance profile, the diagnostic rule, etc. may be stored in the storage unit 140. Additionally, the target voltage measured by the voltage measuring unit 110 and the target resistance measured by the resistance measuring unit 120 may also be stored in the storage unit 140. The control unit 130 may access the storage unit 140 to obtain related information and diagnose the state of the battery based on the obtained information.

Figure 7:
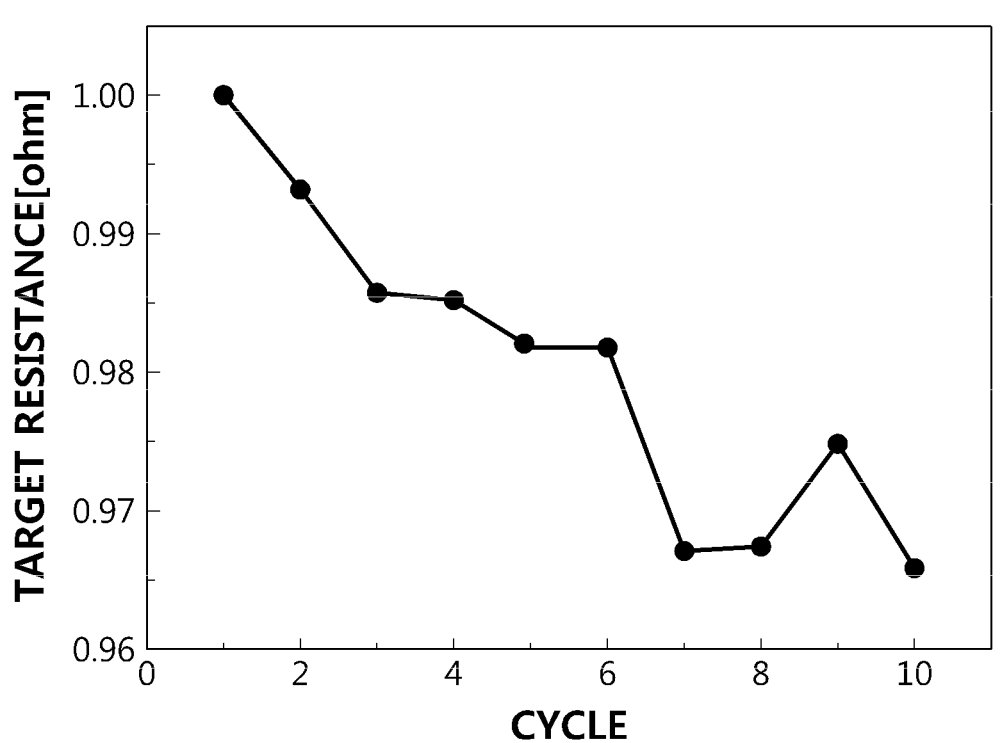
FIG. 7 is a diagram schematically showing a first resistance profile for the first battery according to an embodiment of the present disclosure.

Hereinafter, an embodiment of the first battery will be described with reference to FIGS. 6 and 7.

Figure 6:
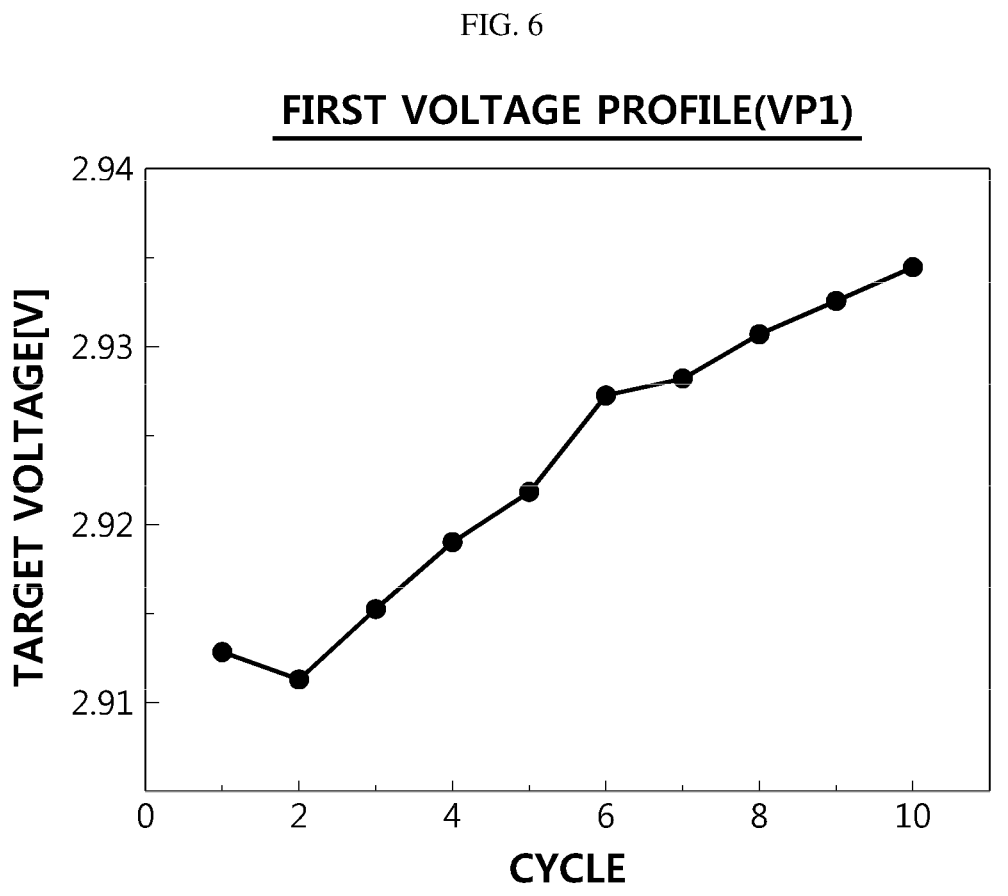

FIG. 6 is a diagram schematically showing a first voltage profile VP1 for a first battery according to an embodiment of the present disclosure. FIG. 7 is a diagram schematically showing a first resistance profile RP1 for the first battery according to an embodiment of the present disclosure. Referring to FIGS. 6 and 7, the target voltage and the target resistance are measured from the first cycle to the 10th cycle for the first battery.

The control unit 130 may select a plurality of target voltages from the first voltage profile VP1. Specifically, the control unit 130 may select a plurality of target voltages by considering the time when the target voltage is measured.

For example, assume that the control unit 130 selects two target voltages. The control unit 130 may first select the target voltage of the 10th cycle and the target voltage of the 9th cycle. In other words, the priority of the target voltage selected by the control unit 130 may be higher as the measured time is closer to the present. Since the target voltage of the 10th cycle is greater than the target voltage of the 9th cycle, the control unit 130 may determine the voltage increase/decrease pattern of the first battery as the first voltage pattern.

Likewise, the control unit 130 may select a plurality of target resistances from the first resistance profile RP1. Specifically, the control unit 130 may select a plurality of target resistances by considering the time when the target resistance is measured.

For example, assume that the control unit 130 selects two target resistances. The control unit 130 may first select the target resistance of the 10th cycle and the target resistance of the 9th cycle. In other words, the priority of the target resistance selected by the control unit 130 may be higher as the measured time is closer to the present. Since the target resistance of the 10th cycle is smaller than the target resistance of the 9th cycle, the control unit 130 may deter-mine the resistance increase/decrease pattern of the first battery as the second resistance pattern.

Since the voltage increase/decrease pattern for the first battery is determined as the first voltage pattern and the resistance increase/decrease pattern is determined as the second resistance pattern, the control unit 130 may diagnose the state of the first battery as a lithium precipitation state.

Figure 9:
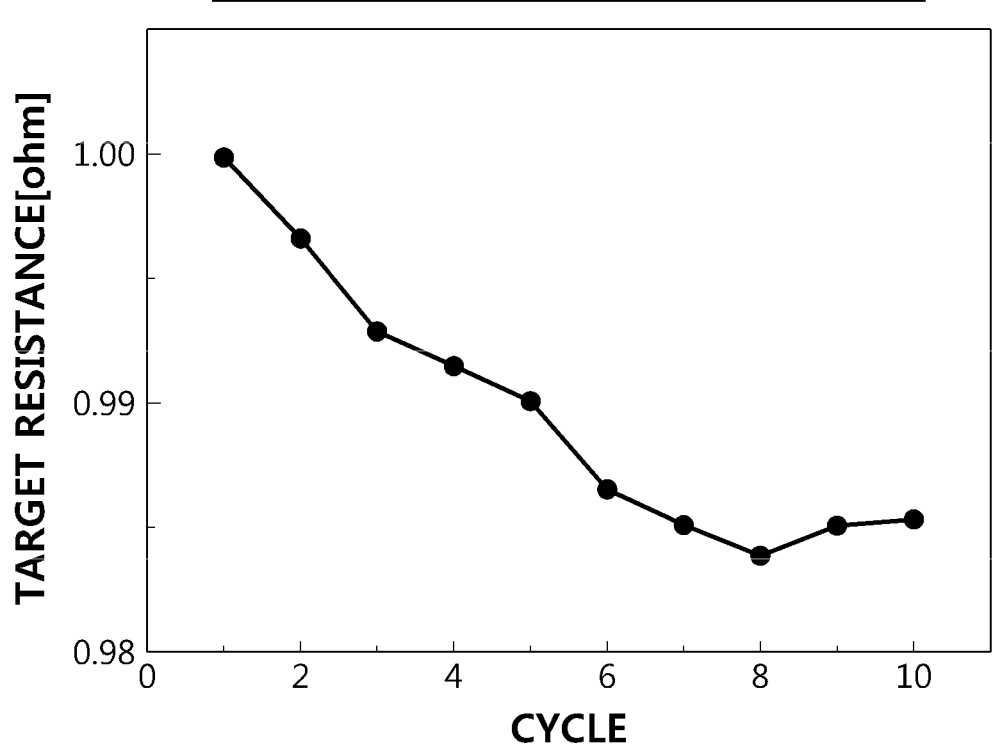
FIG. 9 is a diagram schematically showing a second resistance profile for the second battery according to an embodiment of the present disclosure.

Hereinafter, an embodiment of the second battery will be described with reference to FIGS. 8 and 9.

Figure 8:
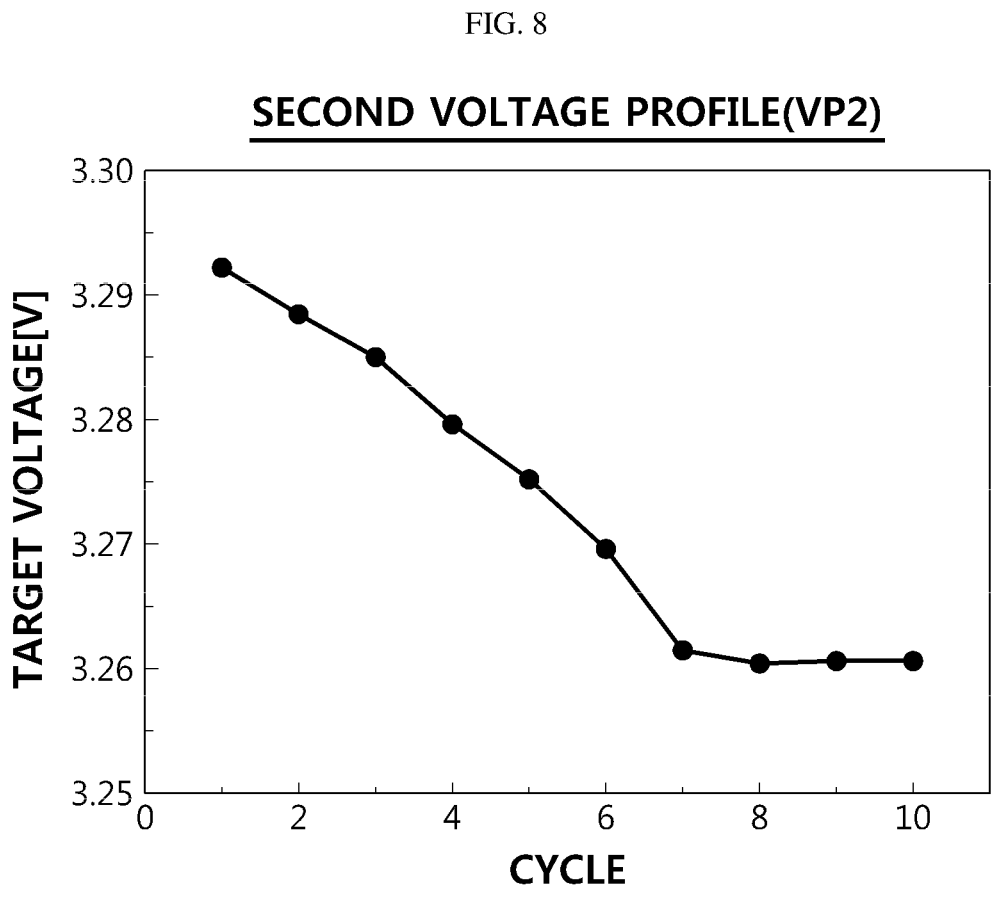

FIG. 8 is a diagram schematically showing a second voltage profile VP2 for a second battery according to an embodiment of the present disclosure. FIG. 9 is a diagram schematically showing a second resistance profile RP2 for the second battery according to an embodiment of the present disclosure. Referring to FIGS. 8 and 9, the target voltage and the target resistance are measured from the first cycle to the 10th cycle for the second battery.

For example, assume that the control unit 130 selects three target voltages. The control unit 130 may select the target voltages of the 8th to 10th cycles. Since the difference between the target voltage of the 8th cycle, the target voltage of the 9th cycle, and the target voltage of the 10th cycle is less than a predetermined threshold, the control unit 130 may determine the voltage increase/decrease pattern of the second battery as the second voltage pattern.

Likewise, the control unit 130 may select three target resistances from the second resistance profile RP2. The three target resistances selected by the control unit 130 may correspond to the selected target voltages. That is, the control unit 130 may select the target resistances of the 8th to 10th cycles. Since the target resistance of the 8th cycle is smallest and the target resistance of the 10th cycle is largest, the control unit 130 may determine the resistance increase/decrease pattern of the second battery as the first resistance pattern.

Since the voltage increase/decrease pattern for the second battery is determined as the second voltage pattern and the resistance increase/decrease pattern is determined as the first resistance pattern, the control unit 130 may diagnose the state of the second battery as a positive electrode deterio-ration state.

Meanwhile, when comparing the first voltage profile VP1 in FIG. 6 and the second voltage profile VP2 in FIG. 8, it may be seen that the first reference voltage set for the first battery and the first reference voltage set for the second battery are different from each other. In other words, the apparatus 100 for diagnosing a state of a battery sets the first reference voltage and the second reference voltage to cor-respond to each state of the battery, so it has the advantage of being able to diagnose the state of the battery more accurately.

The control unit 130 may be configured to set an operation condition for the battery to correspond to the diagnosis result for the state of the battery.

Specifically, the control unit 130 may set the operation condition of the battery to correspond to the battery state diagnosis result in order to prevent or delay battery deterio-ration. Here, the initial operating condition for the battery may be set when the battery is shipped. Generally, a charge/discharge test is performed during the battery manufacturing stage, and the initial operating conditions of the battery may be set according to the result of the charge/discharge test. Also, the battery may be shipped with the initial operating conditions set. For example, the initial operation condition may be set in advance for the charge/discharge C-rate (Current rate), the temperature range, and the SOC avail-ability range. Therefore, in order to increase the lifespan of the battery, the control unit 130 may change and set the initial operation condition of the battery based on the state diagnosis result.

The control unit 130 may be configured to reduce at least one of the temperature and the upper limit SOC of the battery when the state of the battery is an electrolyte side reaction state or a positive electrode deterioration state. That is, the control unit 130 may suppress electrolyte decompo-sition reaction or capacity loss of the positive electrode by reducing at least one of the temperature and the upper limit SOC of the battery. If the state of the battery is diagnosed as a lithium precipitation state, the control unit 130 may set the operation condition of the battery so that the lithium precipitation reaction is suppressed. For example, the control unit 130 may be configured to reduce the upper limit of the charge/discharge C-rate of the battery.

If the state of the battery is diagnosed as a negative electrode stabilization state, the control unit 130 may not change the operation condition of the battery. In other words, the control unit 130 may maintain the operation condition of the battery set at the time of shipment.

The apparatus 100 for diagnosing a state of a battery according to an embodiment of the present disclosure may accurately and quickly diagnose the state of a battery based on a voltage increase/decrease pattern and a resistance increase/decrease pattern. In addition, the apparatus 100 for diagnosing a state of a battery has the advantage of increasing the lifespan of the battery by setting the operation condition for the battery to correspond to the state diagnosis result.

Preferably, the control unit 130 may be configured to diagnose the state of the battery whenever the voltage profile and the resistance profile are updated. In other words, the operation condition for the battery may be set to an optimal condition by reflecting the current state of the battery.

In general, a battery may be deteriorated due to various side reactions, and the optimal operating conditions corresponding to each side reaction may be different. Therefore, the apparatus 100 for diagnosing a state of a battery has the advantage of being able to increase the lifespan of the battery by quickly and accurately diagnosing the current state of the battery and setting the optimal operation condition corresponding to the diagnosis result.

The apparatus 100 for diagnosing a state of a battery according to the present disclosure may be applied to a battery management system (BMS). That is, the BMS according to the present disclosure may include the apparatus 100 for diagnosing a state of a battery described above. In this configuration, at least some of components of the apparatus 100 for diagnosing a state of a battery may be implemented by supplementing or adding functions of the components included in a conventional BMS. For example, the voltage measuring unit 110, the resistance measuring unit 120, the control unit 130 and the storage unit 140 of the apparatus 100 for diagnosing a state of a battery may be implemented as components of the BMS.

Additionally, the apparatus 100 for diagnosing a state of battery according to the present disclosure may be provided in the battery pack. That is, the battery pack according to the present disclosure may include the above-described apparatus 100 for diagnosing a state of battery and at least one battery cell. Additionally, the battery pack may further include electrical components (relays, fuses, etc.) and a case.

Figure 10:
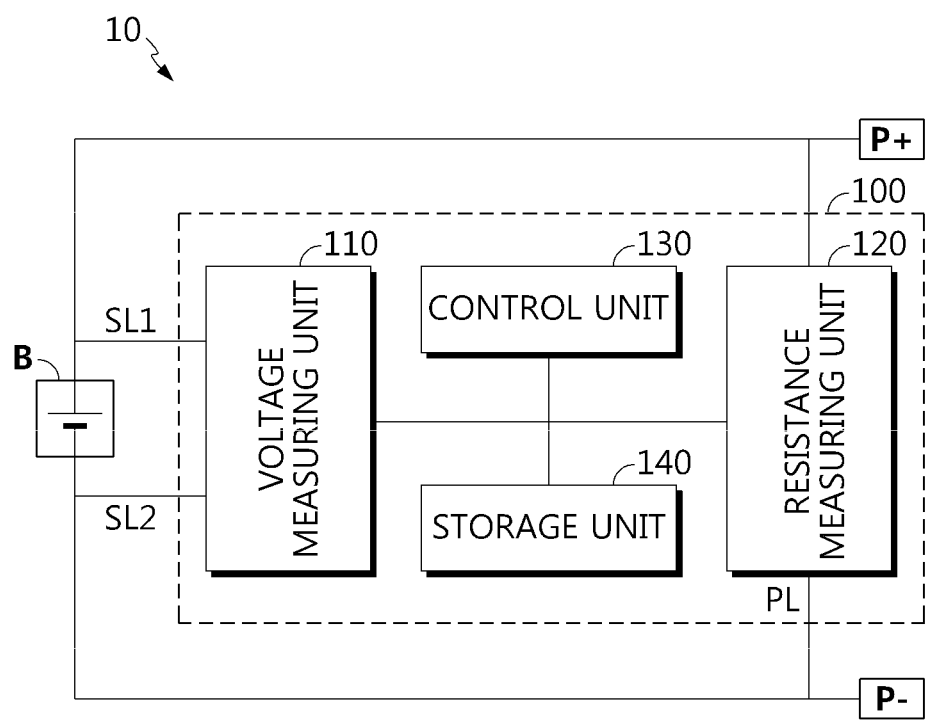
FIG. 10 is a diagram schematically showing an exemplary configuration of a battery pack according to another embodiment of the present disclosure.

FIG. 10 is a diagram schematically showing an exemplary configuration of a battery pack according to another embodiment of the present disclosure.

The positive electrode terminal of the battery B may be connected to the positive electrode terminal P+ of the battery pack 10, and the negative electrode terminal of the battery B may be connected to the negative electrode terminal P– of the battery pack 10.

The voltage measuring unit 110 may be connected to the first sensing line SL1 and the second sensing line SL2. Specifically, the voltage measuring unit 110 may be connected to the positive electrode terminal of the battery B through the first sensing line SL1, and may be connected to the negative electrode terminal of the battery B through the second sensing line SL2. The voltage measuring unit 110 may measure the voltage of the battery B based on the voltage measured at each of the first sensing line SL1 and the second sensing line SL2.

The resistance measuring unit 120 may be connected to the pulse line PL. Specifically, the resistance measuring unit 120 may be connected to the positive electrode terminal of the battery B through the pulse line PL. Also, the resistance measuring unit 120 may measure the resistance of the battery B by outputting a pulse signal to the pulse line PL.

For example, in the embodiment of FIG. 10, the resistance measuring unit 120 may output a pulse signal through the pulse line PL for 0.1 seconds. The voltage measuring unit 110 may measure the voltage of the battery B for 0.1 seconds, and the resistance measuring unit 120 may calculate the voltage change amount of the battery B for 0.1 seconds during which a pulse signal is output. Additionally, the resistance measuring unit 120 may measure the target resistance of the battery B based on the current amount of the pulse signal and the voltage change amount of the battery B.

Referring to FIG. 10, the voltage measuring unit 110, the resistance measuring unit 120, the control unit 130, and the storage unit 140 may be connected to communicate with each other.

Meanwhile, one end of a charging device or load may be connected to the positive electrode terminal (P+) of the battery pack 10, and the other end may be connected to the negative electrode terminal (P–) of the battery pack 10. The battery B may be charged by the charging device, and the load may receive power from the battery B. For example, the load may be a motor of an electric vehicle.

In another embodiment, the resistance measuring unit 120 may be connected to a current sensor (not shown) included in the battery pack 10. The resistance measuring unit 120 may measure the discharge current of the battery through the current sensor. Additionally, the resistance measuring unit 120 may calculate the discharging current amount for a predetermined period of time from the time the battery voltage reaches the second reference voltage. The resistance measuring unit 120 may calculate the target resistance using the voltage change amount of the battery measured by the voltage measuring unit 110 and the calculated discharging current amount.

That is, depending on the embodiment, the resistance measuring unit 120 may measure the target resistance by directly outputting a pulse signal or may measure the target resistance by measuring the discharge current.

In addition, the apparatus 100 for diagnosing a state of a battery according to an embodiment of the present disclosure may be included in a vehicle. Specifically, the battery pack including the apparatus 100 for diagnosing a state of a battery may be included in a vehicle such as an electric vehicle (EV) or a hybrid vehicle (HV). Additionally, the battery pack may drive the vehicle by supplying power to the motor through an inverter provided in the vehicle.

Figure 11:
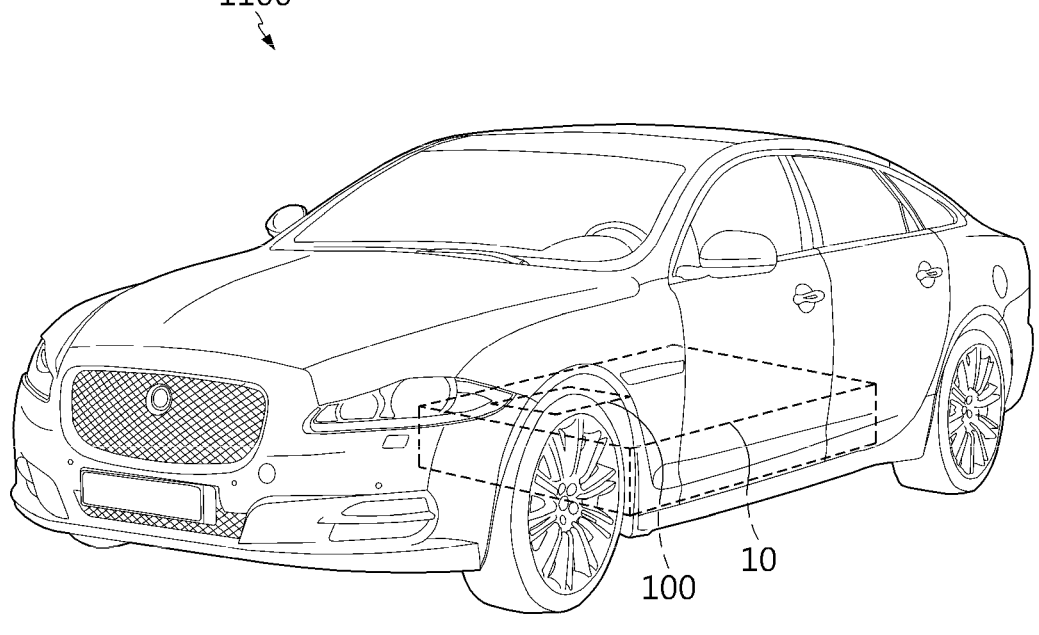
FIG. 11 is a diagram schematically showing an electric vehicle according to still another embodiment of the present disclosure.

FIG. 11 is a diagram schematically showing an exemplary configuration of an electric vehicle 1100 according to still another embodiment of the present disclosure.

In the embodiment of FIG. 11, the vehicle 1100 may include the apparatus 100 for diagnosing a state of a battery, and a battery pack 10. The battery pack 10 may supply power to a motor of the vehicle 1100 so that the vehicle 1100 may be started and/or driven. Additionally, when a charging device is connected to the vehicle 1100, the battery pack 10 may be charged by the charging device. That is, the vehicle 1100 may include the apparatus 100 for diagnosing a state of a battery. In this case, the apparatus 100 for diagnosing a state of a battery may be an on-board diagnostic device included in the vehicle 1100.

Additionally, the apparatus 100 for diagnosing a state of a battery according to the present disclosure may be provided in an energy storage system 1200.

Figure 12:
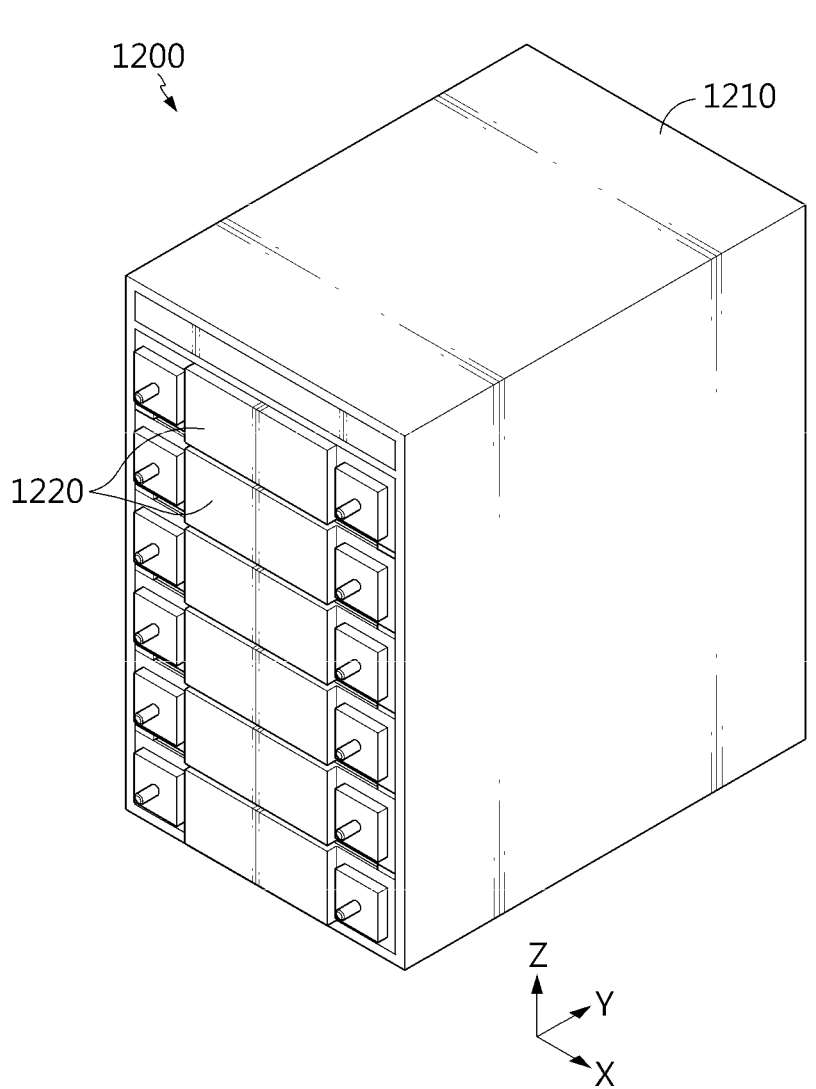
FIG. 12 is a diagram schematically showing an energy storage system according to still another embodiment of the present disclosure.

FIG. 12 is a diagram schematically showing an exemplary configuration of an energy storage system 1200 according to still another embodiment of the present disclosure.

In the embodiment of FIG. 12, the energy storage system 1200 may include a battery rack 1210. Preferably, the energy storage system 1200 may include a plurality of battery racks 1210. One battery rack 1210 may include one or more battery modules 1220. Additionally, the apparatus 100 for diagnosing a state of a battery may be provided in each battery module 1220 and diagnose the state of one or more battery cells included in the battery module 1220. Additionally, the apparatus 100 for diagnosing a state of a battery may also diagnose the state of the battery module 1220 in the same manner as diagnosing the state of the battery.

Figure 13:
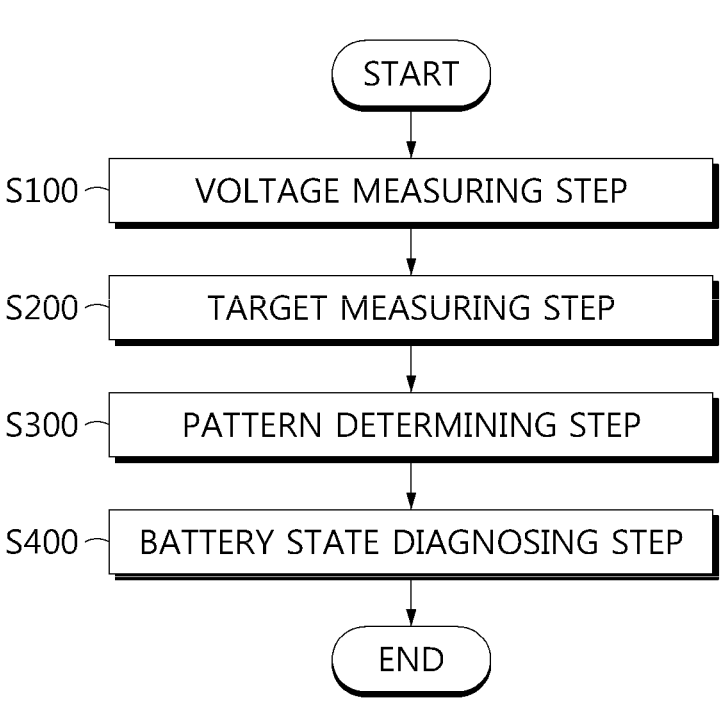
FIG. 13 is a diagram schematically showing a method for diagnosing a state of a battery according to still another embodiment of the present disclosure.

FIG. 13 is a diagram schematically showing a method for diagnosing a state of a battery according to still another embodiment of the present disclosure.

Preferably, each step of the method for diagnosing a state of a battery may be performed by the apparatus 100 for diagnosing a state of a battery. Hereinafter, for convenience of explanation, content that is the same as previously described will be briefly described or omitted.

Referring to FIG. 13, the method for diagnosing a state of a battery may include a voltage measuring step (S100), a target measuring step (S200), a pattern determining step (S300), and a battery state diagnosing step (S400).

The voltage measuring step (S100) is a step of measuring the voltage of the battery, and may be performed by the voltage measuring unit 110.

The target measuring step (S200) is a step of measuring the target voltage for the battery when the measured voltage reaches a preset first reference voltage and measuring the target resistance of the battery when the measured voltage reaches a preset second reference voltage, and may be performed by the voltage measuring unit 110 and the resistance measuring unit 120.

Specifically, the voltage measuring unit 110 may measure the target voltage, and the resistance measuring unit 120 may measure the target resistance.

The voltage measuring unit 110 may measure the target voltage of the battery when the measured voltage reaches the first reference voltage and the battery is maintained in an unloaded state for a certain period of time.

Also, when the measured voltage reaches the second reference voltage, the resistance measuring unit 120 may calculate the target resistance based on the voltage change amount and the discharging current amount of the battery for a predetermined time.

The pattern determining step (S300) is a step of determining the voltage increase/decrease pattern for the target voltage based on the voltage profile in which the target voltage is stored and determining the resistance increase/decrease pattern for the target resistance based on the resistance profile in which the target resistance is stored, and may be performed by the control unit 130.

The control unit 130 may determine the voltage increase/decrease pattern as the first voltage pattern or the second voltage pattern by comparing the plurality of target voltages included in the voltage profile.

The control unit 130 may determine the resistance increase/decrease pattern as the first resistance pattern or the second resistance pattern by comparing the plurality of target resistances included in the resistance profile.

Here, note that the order in which the voltage increase/decrease pattern and the resistance increase/decrease pattern are determined is not particularly limited.

The battery state diagnosing step (S400) is a step of diagnosing the state of the battery from the voltage increase/decrease pattern and the resistance increase/decrease pattern according to a preset diagnostic rule, and may be performed by the control unit 130.

The control unit 130 may diagnose the state of the battery to correspond to the combination of the determined voltage increase/decrease pattern and resistance increase/decrease pattern. For example, the control unit 130 may diagnose the current state of the battery by referring to the diagnostic rule in FIG. 5.

The method for diagnosing a state of a battery according to an embodiment of the present disclosure has the advantage of classifying and diagnosing the state of the battery according to the combination of the voltage increase/decrease pattern and the resistance increase/decrease pattern of the battery. Since the state of the battery may be diagnosed based on voltage and resistance, the current state of the battery may be diagnosed quickly. Therefore, according to the present disclosure, there is an advantage that the current state of the battery may be diagnosed quickly and accurately.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

Explanation of Reference Signs

10: battery pack

100: apparatus for diagnosing a state of a battery

110: voltage measuring unit

120: resistance measuring unit

130: control unit

140: storage unit

1100: vehicle

1200: energy storage system

1210: battery rack

1220: battery module

What is claimed is:

1. An apparatus for diagnosing a state of a battery, comprising:

a control unit configured to:

receive a measured target voltage of the battery, wherein the target voltage of the battery is measured at a time that a measured voltage of the battery reaches a preset first reference voltage, receive a target resistance of the battery, wherein the target resistance of the battery is measured at a time that the measured voltage of the battery reaches a preset second reference voltage that is different from the preset first reference voltage, determine a voltage increase/decrease pattern for the target voltage based on a voltage profile in which the target voltage is stored, determine a resistance increase/decrease pattern for the target resistance based on a resistance profile in which the target resistance is stored, and diagnose a state of the battery from the voltage increase/decrease pattern and the resistance increase/decrease pattern according to a preset diagnostic rule.

2. The apparatus for diagnosing a state of a battery according to claim 1, wherein the control unit is configured to:

determine whether the voltage increase/decrease pattern belongs to a first voltage pattern or to a second voltage pattern, determine whether the resistance increase/decrease pattern belongs to a first resistance pattern or to a second resistance pattern, and diagnose the state of the battery based on a combination of whether the voltage increase/decrease pattern belongs to the first voltage pattern or to the second voltage pattern and whether the resistance increase/decrease pattern belongs to the first resistance pattern or to the second resistance pattern.

3. The apparatus for diagnosing a state of a battery according to claim 2, wherein the control unit is configured to diagnose the state of the battery as one of an electrolyte side reaction state, a lithium precipitation state, a positive electrode deterioration state, or a negative electrode stabilization state.

4. The apparatus for diagnosing a state of a battery according to claim 3, wherein the control unit is configured to diagnose the state of the battery as the electrolyte side reaction state in response to the voltage increase/decrease pattern belonging to the first voltage pattern and the resistance increase/decrease pattern belonging to the first resistance pattern.

5. The apparatus for diagnosing a state of a battery according to claim 3, wherein the control unit is configured to diagnose the state of the battery as the lithium precipitation state in response to the voltage increase/decrease pattern belonging to the first voltage pattern and the resistance increase/decrease pattern belonging to the second resistance pattern.

6. The apparatus for diagnosing a state of a battery according to claim 3, wherein the control unit is configured to diagnose the state of the battery as the positive electrode deterioration state in response to the voltage increase/decrease pattern belonging to the second voltage pattern and the resistance increase/decrease pattern belonging to the first resistance pattern.

7. The apparatus for diagnosing a state of a battery according to claim 3, wherein the control unit is configured to diagnose the state of the battery as the negative electrode stabilization state in response to the voltage increase/decrease pattern belonging to be the second voltage pattern and the resistance increase/decrease pattern belonging to the second resistance pattern.

8. The apparatus for diagnosing a state of a battery according to claim 3, wherein the control unit is configured to control an operation condition of the battery based on the diagnosed state of the battery.

9. The apparatus for diagnosing a state of a battery according to claim 8, wherein the control unit is configured to reduce at least one of a temperature and an upper limit SOC of the battery in response to the state of the battery being diagnosed as the electrolyte side reaction state or the positive electrode deterioration state, and wherein the control unit is configured to reduce an upper limit of a charge/discharge C-rate of the battery in response to the state of the battery being diagnosed as the lithium precipitation state.

10. The apparatus for diagnosing a state of a battery according to claim 1, wherein the control unit is configured to diagnose the state of the battery in response to an update to the voltage profile and the resistance profile of the battery.

11. The apparatus for diagnosing a state of a battery according to claim 1, wherein the target resistance is based on a voltage change amount of the battery during a predetermined period of time beginning when the measured voltage reaches the second reference voltage.

12. The apparatus for diagnosing a state of a battery according to claim 1, wherein the first reference voltage is a discharge end voltage set for the battery.

13. The apparatus for diagnosing a state of a battery according to claim 1, wherein the second reference voltage corresponds to a voltage value in a flat section of the resistance profile.

14. A battery pack, comprising the apparatus for diagnosing a state of a battery according to claim 1.

15. A method for diagnosing a state of a battery, comprising:

measuring a voltage of a battery;

measuring a target voltage for the battery at a time that the measured voltage reaches a preset first reference voltage;

measuring a target resistance of the battery at a time that the measured voltage reaches a preset second reference voltage that is different from the preset first reference voltage;

determining a voltage increase/decrease pattern for the target voltage based on a voltage profile in which the target voltage is stored and determining a resistance increase/decrease pattern for the target resistance based on a resistance profile in which the target resistance is stored; and diagnosing a state of the battery from the voltage increase/decrease pattern and the resistance increase/decrease pattern according to a preset diagnostic rule.

16. The apparatus for diagnosing a state of a battery according to claim 1, wherein the resistance profile is a negative electrode resistance profile.

\* \* \* \* \*